US006418226B2

(12) United States Patent
Mukojima

(10) Patent No.: US 6,418,226 B2
(45) **Date of Patent: *Jul. 9, 2002**

(54) METHOD OF POSITIONING SOUND IMAGE WITH DISTANCE ADJUSTMENT

(75) Inventor: Masahiro Mukojima, Hamamatsu (JP)

(73) Assignee: Yamaha Corporation, Hamamatsu (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/988,115

(22) Filed: Dec. 10, 1997

(30) Foreign Application Priority Data

Dec. 12, 1996 (JP) .............................................. 8-332338

(51) Int. Cl.[7] ............................ H04R 5/00; H03G 3/00

(52) U.S. Cl. ............................ 381/17; 381/18; 381/61; 381/63

(58) Field of Search ............................ 381/17, 18, 61, 381/63, 1

(56) References Cited

U.S. PATENT DOCUMENTS

| | | | | |
|---|---|---|---|---|
| 4,817,149 A | * 3/1989 | Myers | 381/1 |
| 5,386,082 A | * 1/1995 | Higashi | 381/26 |
| 5,440,639 A | * 8/1995 | Suzuki et al. | 381/17 |
| 5,822,438 A | * 10/1998 | Sekine et al. | 381/17 |

FOREIGN PATENT DOCUMENTS

| | | |
|---|---|---|
| JP | 6-233869 | 8/1994 |
| JP | 7-111699 | 4/1995 |
| JP | 7-312800 | 11/1995 |
| JP | 8-205298 | 8/1996 |
| JP | 9-182200 | 7/1997 |

* cited by examiner

*Primary Examiner*—Forester W. Isen
*Assistant Examiner*—Laura A. Grier
(74) *Attorney, Agent, or Firm*—Morrison & Foerster LLP

(57) ABSTRACT

A sound apparatus is constructed for directing a sound image of a virtual sound source at a designated source point to a listener in a virtual sound field. In the sound apparatus, a database provisionally memorizes acoustic transfer characteristics of the virtual sound field in correspondence to reference source points distributed radially around a center point of the listener. Left and right filters respectively filter audio signals of left and right channels according to the acoustic transfer characteristics loaded from the database. A processor computes a leftward acoustic direction from the designated source point to a left ear of the listener, and computes a rightward acoustic direction from the designated source point to a right ear of the listener. A controller specifies a leftward reference source point coincident with the leftward acoustic direction to load an effective acoustic transfer characteristic corresponding to the leftward reference source point from the database into the left filter, and specifies a rightward reference source point coincident with the rightward acoustic direction to load another effective acoustic transfer characteristic corresponding to the rightward reference source point from the database into the right filter. A feeder feeds an audio signal of the left channel to the left filter and feeds another audio signal of the right channel to the right filter to thereby direct the sound image of the virtual sound source located at the source point to the listener positioned at the center point.

20 Claims, 3 Drawing Sheets

METHOD OF POSITIONING SOUND IMAGE WITH DISTANCE ADJUSTMENT

BACKGROUND OF THE INVENTION

1. Field of the Invention

The present invention generally relates to a method of positioning a sound image and a sound image positioning apparatus for use in a three-dimensional sound system or else. More particularly, the present invention relates to a method of simulating acoustic transfer characteristics from a virtual sound source in a virtual sound field.

2. Description of Related Art

In a three-dimensional virtual reality system for example, a sound image positioning apparatus is conventionally used as a means for enhancing presence of virtual reality experience. In such a system, a cubic sound field is generated by creating direction perspective and distance perspective in auditory sensation by producing audio signals from a monaural sound source through a plurality of channels having time difference, amplitude difference, and frequency characteristic difference based on binaural technique. To be more specific, an input audio signal is attenuated in a particular frequency component by a notch filter, for example, to create elevation. The input audio signal is also converted by a delay circuit into left channel and right channel signals having a time difference, and is further given acoustic transfer characteristic from a virtual sound source by a FIR (Finite Impulse Response) filter. A parameter of the FIR filter is given from an HRTF database storing head-related transfer functions (HRTF) measured with using a dummy head in advance.

In the above-mentioned conventional sound image positioning apparatus, it is impracticable to store the HRTFs corresponding to all virtual sound source points included in a sound field. Normally, only the transfer characteristics at points radially away from a listener by a certain distance, for example one meter, are measured and stored. Therefore, if a virtual sound source is located one meter away from a listener as shown in FIG. 5, proper sound image positioning can be provided. However, if the virtual sound source is located from the listener at a distance more or less one meter, problem occurs that sound images sensed by the right and left ears of the listener do not match each other, losing good positioning. Especially, it is known that the human ear has an angular resolution of ±3° for acoustic direction. Therefore, if a virtual sound source passes across the listener, an error higher than ±3° may occur, thereby causing a sense of incongruity.

SUMMARY OF THE INVENTION

It is therefore an object of the present invention to provide a sound image positioning method and a sound image positioning apparatus for positioning a sound image to a correct point even if there is a difference between a reference distance used for measuring a head-related transfer function stored beforehand and a setting distance of a virtual sound source.

The inventive method pans a sound image of a virtual sound source to a listener in a virtual sound field by filtering audio signals of left and right channels through left and right filters which simulate acoustic transfer characteristics of the virtual sound field. The inventive method comprises the steps of provisionally memorizing acoustic transfer characteristics of the virtual sound field which are distributed radially around a center point of the listener, designating a source point at which the virtual sound source is to be located within the virtual sound field in terms of a geometric distance and a geometric direction relative to the center point, computing a leftward acoustic direction from the source point to a left ear of the listener according to the geometric distance, the geometric direction and an offset of the left ear from the center point, computing a rightward acoustic direction from the source point to a right ear of the listener according to the geometric distance, the geometric direction and an offset of the right ear from the center point, determining an effective acoustic transfer characteristic based on the memorized acoustic transfer characteristics according to the leftward acoustic direction so as to enable the left filter to simulate said effective transfer characteristic, determining another effective acoustic transfer characteristic based on the memorized acoustic transfer characteristics according to the rightward acoustic direction so as to enable the right filter to simulate said another effective transfer characteristic, and filtering an audio signal of the left channel through the left filter and filtering another audio signal of the right channel through the right filter to thereby direct the sound image of the virtual sound source located at the source point to the listener positioned at the center point.

Further, the inventive apparatus is constructed for directing a sound image of a virtual sound source at a designated source point to a listener in a virtual sound field. In the inventive apparatus, a database provisionally memorizes acoustic transfer characteristics of the virtual sound field in correspondence to reference source points distributed radially around a center point of the listener. Left and right filters respectively filter audio signals of left and right channels according to the acoustic transfer characteristics loaded from the database. A processor computes a leftward acoustic direction from the designated source point to a left ear of the listener, and computes a rightward acoustic direction from the designated source point to a right ear of the listener. A controller specifies a leftward reference source point coincident with the leftward acoustic direction to load an effective acoustic transfer characteristic corresponding to the leftward reference source point from the database into the left filter, and specifies a rightward reference source point coincident with the rightward acoustic direction to load another effective acoustic transfer characteristic corresponding to the rightward reference source point from the database into the right filter. A feeder feeds an audio signal of the left channel to the left filter and feeds another audio signal of the right channel to the right filter to thereby direct the sound image of the virtual sound source located at the source point to the listener positioned at the center point.

In a different view, the inventive apparatus is arranged for directing a sound image of a virtual sound source to a listener in a virtual sound field. In the apparatus, a database provisionally memorizes a pair of leftward and rightward acoustic transfer characteristics of the virtual sound field in correspondence to each of sample points distributed radially around a center point of the listener at a fixed radius, the leftward acoustic transfer characteristic simulating a path from each sample point to a left ear of the listener and the rightward acoustic transfer characteristic simulating another path from each sample point to a right ear of the listener. Left and right filters respectively filter audio signals of left and right channels according to the left and right acoustic transfer characteristics loaded from the database. An input designates a source point at which the virtual sound source is to be located within the virtual sound field in a distance which may be different from the fixed radius relative to the center point. A processor computes a leftward acoustic direction from the source point to the left ear of the listener, and computes a rightward acoustic direction from the source point to the right ear of the listener. A controller specifies a leftward sample point substantially coincident with the leftward acoustic direction to load the leftward transfer characteristic corresponding to the leftward sample point from the database into the left filter, and specifies a rightward sample point substantially coincident with the rightward acoustic direction to load the rightward acoustic transfer characteristic corresponding to the rightward sample point from the database into the right filter. A feeder feeds an audio signal of the left channel to the left filter and feeds another audio signal of the right channel to the right filter to thereby direct the sound image of the virtual sound source located at the source point to the listener positioned at the center point.

According to the present invention, as shown in FIG. 3, based on the geometric distance r and geometric direction θ to the virtual sound source point Ps and the offset 2*h* between both ears of the listener, the acoustic directions R and L from the virtual sound source point Ps to the right and left ears of the listener are calculated separately for the right and left channels. Acoustic transfer characteristics of the right and left filters are determined by these acoustic transfer directions R and L. To be more specific, sample points PR and PL coincident with the acoustic directions R and L are identified on a circumference having the fixed radius r0 that is the reference distance. If the setting distance r to the virtual sound source point Ps differs from the reference distance r0 at which the acoustic transfer characteristics are measured, the acoustic transfer characteristics corresponding to the sample points PR and PL are used as the effective acoustic transfer characteristics of both channels. Approximating the effective or true characteristics from the object distance r by these acoustic transfer characteristics provides high fidelity of the sound image positioning. The above-mentioned acoustic transfer characteristics are stored in the transfer characteristic database beforehand at a fine angular pitch, for example, in unit of 1° on the circumference away from the listener by the fixed reference distance r0. Alternatively, the data may be stored at a coarse angular pitch, for example, in unit of 90° in forward, backward, rightward and leftward directions. In the latter case, the effective acoustic transfer characteristic corresponding to the acoustic direction concerned may be obtained by vector compoint or composition according to the calculated acoustic directions R and L. Consequently, according to the present invention, an acoustic transfer characteristic of higher fidelity can be obtained with generally the same data volume as that used in the prior art technology. Conversely, a smaller data volume than that conventionally used may be enough for achieving generally the same acoustic transfer characteristic as that of the prior art technology.

BRIEF DESCRIPTION OF THE DRAWINGS

These and other objects of the invention will be seen by reference to the description, taken in connection with the accompanying drawing, in which.

DETAILED DESCRIPTION OF PREFERRED EMBODIMENTS

Figure 1:
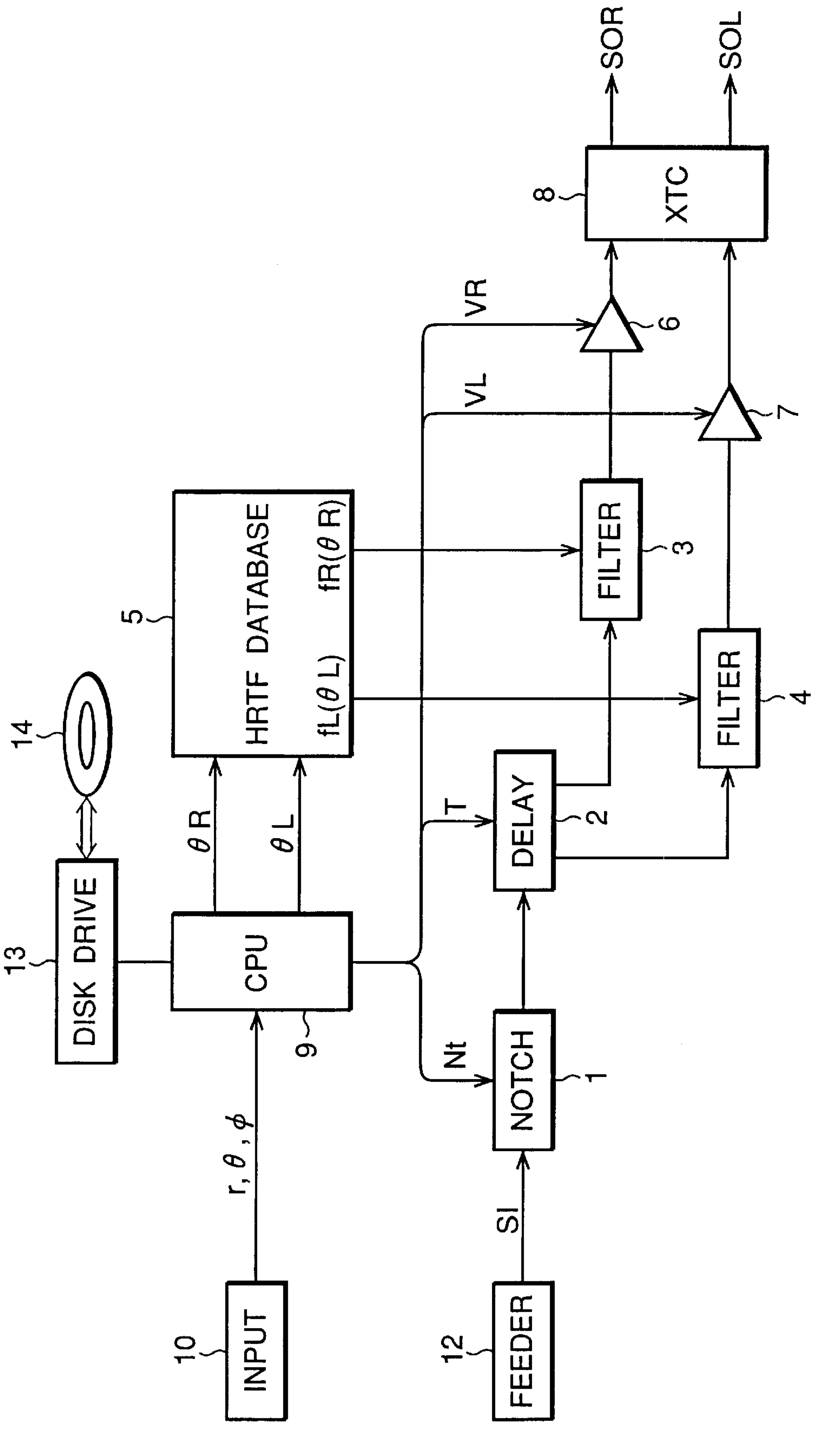
FIG. 1 is a block diagram illustrating constitution of a sound image positioning apparatus practiced as one preferred embodiment of the present invention.

This invention will be described in further detail by way of example with reference to the accompanying drawings. Now, referring to FIG. 1, there is shown a block diagram illustrating a sound image positioning apparatus, panning apparatus or localizing apparatus practiced by a personal computer or the like as one preferred embodiment of the present invention. An input monaural audio signal SI is supplied to a notch filter 1 from a feeder 12 or monaural sound source. The notch filter 1 attenuates a particular frequency component Nt of the audio signal SI based on human auditory characteristic to impart elevational positioning to the input audio signal SI. An output of the notch filter 1 is delayed by a delay circuit 2 to produce two-channel stereophonic audio signals imparted with a sound transfer time lag T from a virtual sound source point to both ears. These stereo signals are supplied to FIR filters 3 and 4, respectively. The FIR filters 3 and 4 impart acoustic transfer characteristics to the audio signals of each channel based on parameters fR(θR) and fL(θL) read from an HRTF database 5. Outputs of the FIR filters 3 and 4 are adjusted in right and left amplitude balance by amplifiers 6 and 7, respectively. Outputs of the amplifiers 6 and 7 are treated by a cross talk canceler (XTC) 8 to eliminate a cross talk that would enter from right and left speakers (not shown) into both ears. The outputs eliminated of cross talk are supplied to the speakers as two-channel audio signals S0R and SOL. A central processing unit (CPU) 9 accepts positional information r, θ, and ϕ of a virtual sound source designated by an input 10. Based on these positional data, a processor in the CPU 9 calculates control parameters for various blocks concerned, and a controller in the CPU 9 supplies the calculated parameters to the various blocks. A disk drive 13 is connected to the CPU 9. The disk drive 13 receives a machine readable medium 14 such as a floppy disk or CD-ROM.

Figure 2:
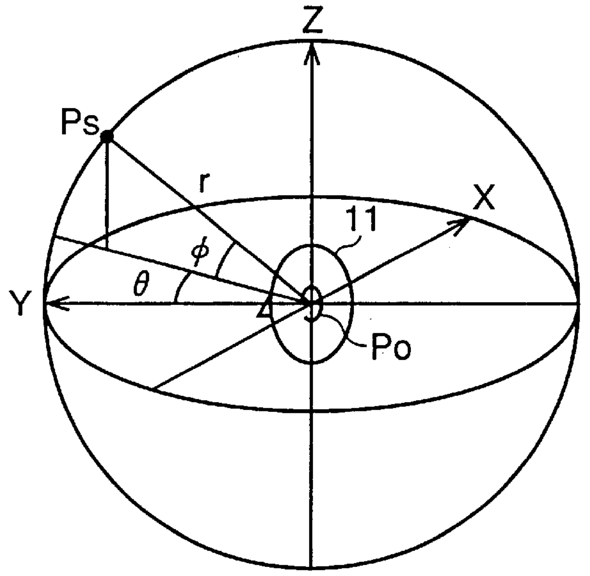
FIG. 2 is a geometric diagram illustrating a point of a virtual sound source and a point of a listener in a virtual sound field.

As shown in FIG. 2, let an intermediate point between both ears of a listener 11 be a center point Po of a three-dimensional coordinates system. Rightward, forward, and upward directions of the listener 11 are set to X axis, Y axis, and Z axis of the absolute coordinate system, respectively. Then, a source point Ps of the virtual sound source is given in terms of a geometric distance r from the center point Po to the virtual sound source, an azimuth angle θ in the horizontal direction of the virtual sound source Ps as viewed from the front side (Y-axis direction) of the listener 11, and an elevation angle ϕ in the vertical direction as viewed from the angle θ relative to the front side of the listener 11.

It is known that, in the human ear, as the angle ϕ in the elevation of the sound source increases, the dead band frequency shifts to higher ranges. The CPU 9 determines the attenuation frequency component Nt by the elevation ϕ to control the frequency response of the notch filter 1. Also, the CPU 9 obtains the transfer time lag T of the right and left channels based on the difference in distance from the virtual sound source point Ps to both ears.

Figure 3:
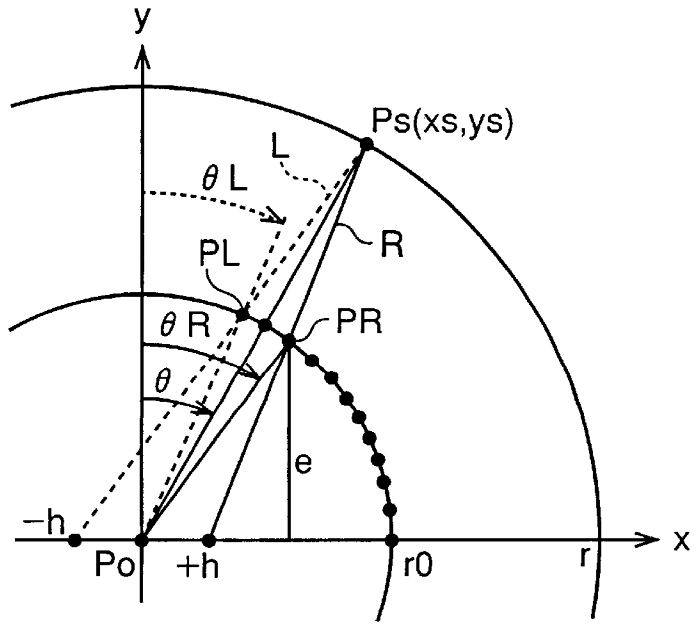
FIG. 3 is a geometric diagram for describing acoustic directions of right and left channels in the preferred embodiment shown in FIG.

The CPU 9 also calculates acoustic transfer angles θR and θL from the virtual sound source to both ears of the listener 11 based on the azimuth θ. To be more specific, as shown in FIG. 3, the HRTF database 5 stores acoustic transfer characteristics from sample points or reference points distributed along a circumference having radius r0 toward the center point Po. The acoustic transfer characteristics are measured beforehand with using a dummy head. The rightward acoustic transfer angle θR of a sound generated from the virtual sound source point Ps to enter into the right ear of the listener positioned at offset distance +h in the X-axis direction is represented by equation (1) below.

$$\theta R = \cos^{-1}(e/r\mathbf{0}) \tag{1}$$

Let straight line R that passes the right ear (x=+h) and the virtual sound source point Ps be:

$$R: y = dx - dh.$$

Since coordinates (xs, ys) of the point Ps are xs=r sinθ ys=r cosθ, d is represented by equation (2) below:

$$d = ys/(xs-h) = \cos\theta/(\sin\theta - h/r) \tag{2}$$

Further, e equivalent to Y coordinate at intersection PR between the circumference having radius r0 and the straight line R is represented by equation (3) below:

$$(e/d+h)^2 + e^2 = r\mathbf{0}^2$$

$$e = \{-b \pm \sqrt{(b^2-4ac)}\}/2a \tag{3}$$

where, $$a = d^2+1$$

$$b = 2dh$$

$$c = d^2(h^2r\mathbf{0}^2)$$

Therefore, the acoustic transfer angle θR of the right channel can be calculated by obtaining e by substituting equation (2) into equation (3) and by substituting obtained e into equation (1). The leftward acoustic transfer angle θL of the left channel can be obtained in similar manner. Consequently, the HRTF database 5 is referenced based on the calculated transfer angles θR and θL of the right and left channels obtained by the CPU 9. To be more specific, the HRTF database 5 stores a pair of filter parameters fR(θ) and fL(θ) at each sample point to represent the acoustic transfer characteristics or functions up to the right and left ears. Each sample point is determined by the fixed distance r0 and the calculated acoustic transfer angle θ. For the rightward transfer angle θR, fR(θR) of the pair of filter parameters fR(θR) and fL(θL) is selected. For the leftward transfer angle θL, fL(θL) of the pair of filter parameters fR(θR) and fL(θL) is selected. The FIR filters 3 and 4 may be operated by these obtained filter parameters fR(θR) and fL(θL), respectively, which represent effective acoustic transfer characteristics from the virtual sound source to the listener 11.

If the sampling point pitch of the HRTF database is coarse and therefore the effective acoustic transfer characteristic data corresponding to the obtained right and left transfer angles θR and θL does not exist in the HRTF database, vector compoint or composition may be performed on a pair of sample points oppositely adjacent to the calculated transfer angle so as to obtain the effective acoustic transfer characteristic data for each of the transfer angles θR and θL by interpolation.

Figure 4:
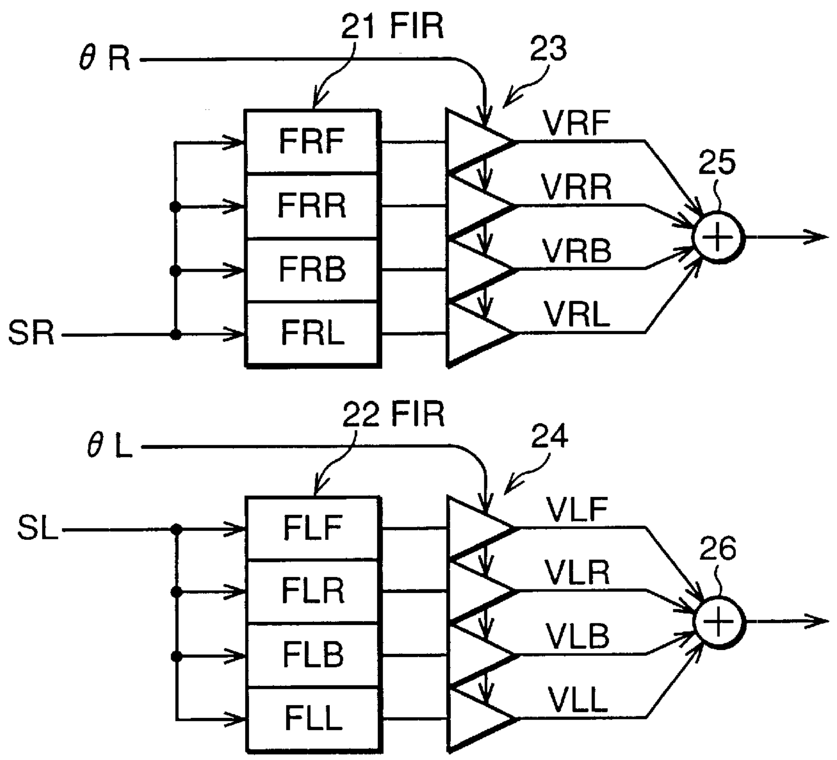
FIG. 4 is a block diagram illustrating constitution of a FIR filter associated with another preferred embodiment of the present invention.
Figure 5:
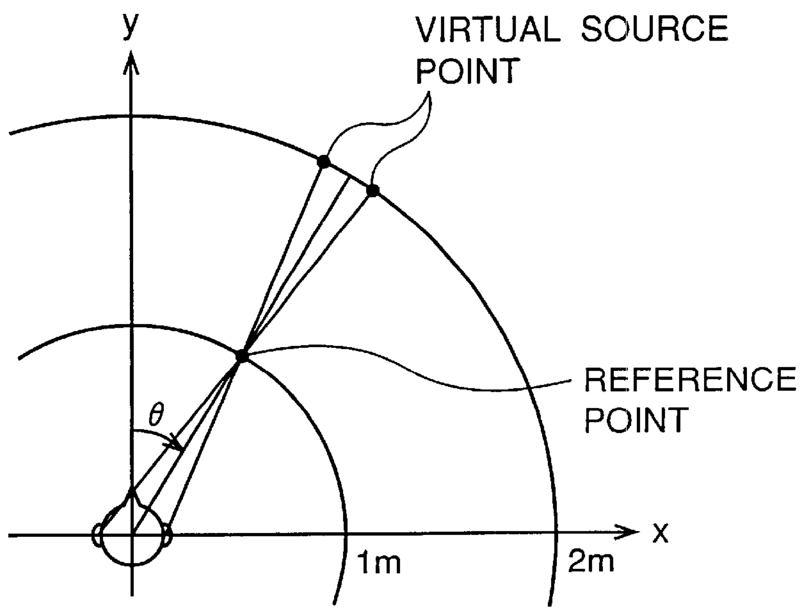
FIG.5 PRIOR ART
FIG. 5 is a geometric diagram for describing a problem of the prior art.

It should be noted that the present invention is not limited to a system that has filter parameters in the database as mentioned above. For example, as shown in FIG. 4, the present invention is also applicable to a system in which the head-related transfer functions corresponding to the forward, backward, rightward, and leftward directions of the listener are given as fixed parameters of FIR filters 21 and 22. Directivity of the sound is imparted by performing amplitude control through amplifiers 23 and 24 according to the obtained transfer angles θR and θL on audio signals SR and SL supplied from the FIR filters 21 and 22, and then by adding amplified results through adders 25 and 26. It should be noted that the FIR filter 21 is divided into sections FRF, FRB, FRL, and FRR corresponding to the forward, backward, leftward and rightward directions. The amplifier 23 is also divided into sections VRF, VRB, VRL and VRR corresponding to the forward, backward, leftward and rightward directions. This holds true with the FIR filter 22 and the amplifier 24 of the left channel.

For summary, referring back again to FIG. 1, the inventive apparatus is constructed for positioning a sound image of a virtual sound source relative to a listener in a virtual sound field. In the apparatus, the database 5 provisionally memorizes acoustic transfer characteristics (fL, fR) of the virtual sound field in correspondence to sample points (θL, θR) distributed radially around a center point of the listener at a fixed radius. The left and right filters 3 and 4 respectively filter audio signals of left and right channels according to the acoustic transfer characteristics (fL, fR) loaded from the database 5. The input 10 designates a source point at which the virtual sound source is to be located within the virtual sound field in terms of a geometric distance r which may be different from the fixed radius and a geometric direction θ relative to the center point. The processor in the CPU 9 computes a leftward acoustic direction from the source point to a left ear of the listener according to the geometric distance r, the geometric direction θ and an offset of the left ear from the center point, and computes a rightward acoustic direction from the source point to a right ear of the listener according to the geometric distance r, the geometric direction θ and an offset of the right ear from the center point. The controller in the CPU 9 specifies a leftward sample point (PL) coincident with the leftward acoustic direction to load an effective acoustic transfer characteristic (fL) corresponding to the leftward sample point (PL) from the database 5 into the left filter 3, and specifies a rightward sample point (PR) coincident with the rightward acoustic direction to load another effective acoustic transfer characteristic (fR) corresponding to the rightward sample point (PR) from the database 5 into the right filter 4. The feeder 12 feeds an audio signal of the left channel to the left filter 3 and feeds another audio signal of the right channel to the right filter 4 to thereby direct the sound image of the virtual sound source located at the source point to the listener positioned at the center point.

The controller may specify a pair of leftward sample points which lie oppositely relative to the leftward acoustic direction such that said effective acoustic transfer characteristic is determined by interpolating the acoustic transfer characteristics corresponding to the pair of the leftward sample points, and may specify another pair of rightward sample points which lie oppositely relative to the rightward acoustic direction such that said another effective acoustic transfer characteristic is determined by interpolating the acoustic transfer characteristics corresponding to the pair of the rightward sample points.

The processor may compute an azimuth component of the leftward acoustic direction from the source point to the left ear of the listener in a three-dimensional space of the virtual sound field such that the leftward sample point is selected substantially coincident with the azimuth component of the leftward acoustic direction, and may compute an azimuth component of the rightward acoustic direction from the source point to the right ear of the listener such that the rightward sample point is selected substantially coincident with the azimuth component of the rightward acoustic direction, thereby directing the sound image of the virtual sound source to the listener in an azimuth direction of the three-dimensional space. Further, the controller may compute an elevation component of an acoustic direction from the source point to the listener according to the geometric distance r and the geometric direction ϕ, and the notch filter 1 filters the audio signal SI according to the elevation component of the acoustic direction so as to direct the sound image of the virtual sound source to the listener in an elevation direction of the three-dimensional space.

The machine readable medium 14 is for use in the inventive apparatus having the CPU 9 and positioning a sound image of a virtual sound source relative to a listener in a virtual sound field by filtering audio signals of left and right channels through left and right filters 3 and 4 which simulate acoustic transfer characteristics of the virtual sound field. As shown in FIG. 3, the medium contains program instructions executable by the CPU for causing the apparatus to perform the steps of provisionally memorizing acoustic transfer characteristics of the virtual sound field allotted to sample points (PL, PR) distributed radially around a center point Po of the listener at a fixed distance r0, designating a source point Ps at which the virtual sound source is to be located within the virtual sound field in terms of a geometric distance r and a geometric direction θ relative to the center point Po, computing a leftward acoustic direction (L) from the source point Ps to a left ear of the listener according to the geometric distance r, the geometric direction θ and an offset −h of the left ear from the center point Po, computing a rightward acoustic direction (R) from the source point Ps to a right ear of the listener according to the geometric distance r, the geometric direction θ and an offset +h of the right ear from the center point Po, selecting a leftward sample point PL substantially coincident with the leftward acoustic direction L to determine an effective acoustic transfer characteristic based on the acoustic transfer characteristic allotted to the leftward sample point PL so as to enable the left filter to simulate said effective transfer characteristic, selecting a rightward sample point PR substantially coincident with the rightward acoustic direction R to determine another effective acoustic transfer characteristic based on the acoustic transfer characteristic allotted to the rightward sample point PR so as to enable the right filter to simulate said another effective transfer characteristic, and filtering an audio signal of the left channel through the left filter and filtering another audio signal of the right channel through the right filter to thereby pan the sound image of the virtual sound source located at the source point Ps to the listener positioned at the center point Po.

Preferably, the step of selecting a leftward sample point comprises selecting a pair of leftward sample points which lie oppositely relative to the leftward acoustic direction such that said effective acoustic transfer characteristic is determined by interpolating the acoustic transfer characteristics allotted to the pair of the leftward sample points, and the step of selecting a rightward sample point comprises selecting a pair of rightward sample points which lie oppositely relative to the rightward acoustic direction such that said another effective acoustic transfer characteristic is determined by interpolating the acoustic transfer characteristics allotted to the pair of the rightward sample points.

Preferably, as shown in FIG. 3, the step of computing a leftward acoustic direction comprises computing an azimuth component (θL) of the leftward acoustic direction from the source point Ps to the left ear of the listener in a three-dimensional space of the virtual sound field such that the leftward sample point is selected substantially coincident with the azimuth component of the leftward acoustic direction, and the step of computing a rightward acoustic direction comprises computing an azimuth component (θR) of the rightward acoustic direction from the source point Ps to the right ear of the listener such that the rightward sample point is selected substantially coincident with the azimuth component of the rightward acoustic direction, thereby directing the sound image of the virtual sound source to the listener in an azimuth direction (θ) of the three-dimensional space. The inventive steps further comprise computing an elevation component (ϕ) of an acoustic direction from the source point Ps to the listener according to the geometric distance r and the geometric direction, and filtering the audio signal according to the elevation component (ϕ) of the acoustic direction so as to direct the sound image of the virtual sound source to the listener in an elevation direction of the three-dimensional space.

As described and according to the present invention, based on the distance and direction from a listener to a virtual sound source point and the distance between both ears of the listener, the acoustic directions from the virtual sound source point to both ears of the listener are independently calculated for the right and left channels. The acoustic transfer characteristics of the filters are determined by the obtained acoustic directions of the right and left channels. Consequently, even if the setting point from the listener to the virtual sound source point differs from the reference distance used for measurement of the acoustic transfer characteristics, the effective acoustic transfer characteristics corresponding to a specified virtual sound source point can be obtained, thereby providing good fidelity of the virtual sound field.

While the preferred embodiments of the present invention have been described using specific terms, such description is for illustrative purposes only, and it is to be understood that changes and variations may be made without departing from the spirit or scope of the appended claims.

What is claimed is:

1. A method of positioning a sound image of a virtual sound source relative to a listener in a virtual sound field by filtering audio signals of left and right channels through left and right filters which simulate acoustic transfer characteristics of the virtual sound field and by provisionally memorizing the acoustic transfer characteristics of the virtual sound field which are distributed radially around a center point of the listener, the method comprising the steps of:

designating a source point at which the virtual sound source is to be located within the virtual sound field in terms of a geometric distance and a geometric direction relative to the center point;

computing a leftward acoustic direction from the source point to a left ear of the listener according to said geometric distance, said geometric direction and an offset of the left ear from the center point;

computing a rightward acoustic direction from the source point to a right ear of the listener according to said geometric distance, said geometric direction and an offset of the right ear from the center point;

determining an effective acoustic transfer characteristic based on the memorized acoustic transfer characteristics according to said leftward acoustic direction so as to enable the left filter to simulate said effective transfer characteristic;

determining another effective acoustic transfer characteristic based on the memorized acoustic transfer characteristics according to said rightward acoustic direction so as to enable the right filter to simulate said another effective transfer characteristic; and filtering an audio signal of the left channel through the left filter and filtering another audio signal of the right channel through the right filter to thereby direct the sound image of the virtual sound source located at the source point to the listener positioned at the center point.

2. A method of positioning a sound image of a virtual sound source to a listener in a virtual sound field by filtering audio signals of left and right channels through left and right filters which simulate acoustic transfer characteristics of the virtual sound field, the method comprising the steps of:

provisionally memorizing acoustic transfer characteristics of the virtual sound field allotted to sample points distributed radially around a center point of the listener;

designating a source point at which the virtual sound source is to be located within the virtual sound field in terms of a geometric distance and a geometric direction relative to the center point;

computing a leftward acoustic direction from the source point to a left ear of the listener according to said geometric distance, said geometric direction and an offset of the left ear from the center point;

computing a rightward acoustic direction from the source point to a right ear of the listener according to said geometric distance, said geometric direction and an offset of the right ear from the center point;

selecting a leftward sample point substantially coincident with the leftward acoustic direction to determine an effective acoustic transfer characteristic based on the acoustic transfer characteristics allotted to the leftward sample point so as to enable the left filter to simulate said effective transfer characteristic;

selecting a rightward sample point substantially coincident with the rightward acoustic direction to determine another effective acoustic transfer characteristic based on the acoustic transfer characteristics allotted to the rightward sample point so as to enable the right filter to simulate said another effective transfer characteristic; and filtering an audio signal of the left channel through the left filter and filtering another audio signal of the right channel through the right filter to thereby direct the sound image of the virtual sound source located at the source point to the listener positioned at the center point.

3. A method according to claim 2, wherein the step of selecting a leftward sample point comprises selecting a pair of leftward sample points which lie oppositely relative to the leftward acoustic direction such that said effective acoustic transfer characteristic is determined by interpolating the acoustic transfer characteristics allotted to the pair of the leftward sample points, and wherein the step of selecting a rightward sample point comprises selecting a pair of rightward sample points which lie oppositely relative to the rightward acoustic direction such that said another effective acoustic transfer characteristic is determined by interpolating the acoustic transfer characteristics allotted to the pair of the rightward sample points.

4. A method according to claim 2, wherein the step of computing the leftward acoustic direction comprises computing an azimuth component of the leftward acoustic direction from the source point to the left ear of the listener in a three-dimensional space of the virtual sound field such that the leftward sample point is selected substantially coincident with the azimuth component of the leftward acoustic direction, and wherein the step of computing the rightward acoustic direction comprises computing an azimuth component of the rightward acoustic direction from the source point to the right ear of the listener such that the rightward sample point is selected substantially coincident with the azimuth component of the rightward acoustic direction, thereby directing the sound image of the virtual sound source to the listener in an azimuth direction of the three-dimensional space.

5. A method according to claim 4, further comprising the steps of computing an elevation component of an acoustic direction from the source point to the listener according to said geometric distance and said geometric direction, and filtering the audio signals according to the elevation component of the acoustic direction so as to direct the sound image of the virtual sound source to the listener in an elevation direction of the three-dimensional space.

6. An apparatus for positioning a sound image of a virtual sound source at a designated source point to a listener in a virtual sound field, comprising:

a database that provisionally memorizes acoustic transfer characteristics of the virtual sound field in correspondence to reference source points distributed radially around a center point of the listener;

left and right filters that respectively filter audio signals of left and right channels according to the acoustic transfer characteristics loaded from the database;

a processor that computes a leftward acoustic direction from the designated source point to a left ear of the listener, and that computes a rightward acoustic direction from the designated source point to a right ear of the listener;

a controller that specifies a leftward reference source point coincident with the leftward acoustic direction to load an effective acoustic transfer characteristic corresponding to the leftward reference source point from the database into the left filter, and that specifies a rightward reference source point coincident with the rightward acoustic direction to load another effective acoustic transfer characteristic corresponding to the rightward reference source point from the database into the right filter; and a feeder that feeds an audio signal of the left channel to the left filter and feeds another audio signal of the right channel to the right filter to thereby direct the sound image of the virtual sound source located at the source point to the listener positioned at the center point.

7. An apparatus for positioning a sound image of a virtual sound source to a listener in a virtual sound field, comprising:

a database that provisionally memorizes a pair of leftward and rightward acoustic transfer characteristics of the virtual sound field in correspondence to each of sample points distributed radially around a center point of the listener at a fixed radius, the leftward acoustic transfer characteristic simulating a path from each sample point to the left ear of the listener and the rightward acoustic transfer characteristic simulating another path from each sample point to the right ear of the listener;

left and right filters that respectively filter audio signals of left and right channels according to the left and right acoustic transfer characteristics loaded from the database;

an input that designates a source point at which the virtual sound source is to be located within the virtual sound field;

a processor that computes a leftward acoustic direction from the source point to the left ear of the listener and that computes a rightward acoustic direction from the source point to the right ear of the listener;

a controller that specifies a leftward sample point substantially coincident with the leftward acoustic direction to load the leftward transfer characteristic corresponding to the leftward sample point from the database into the left filter, and that specifies a rightward sample point substantially coincident with the rightward acoustic direction to load the rightward acoustic transfer characteristic corresponding to the rightward sample point from the database into the right filter; and a feeder that feeds an audio signal of the left channel to the left filter and feeds another audio signal of the right channel to the right filter to thereby direct the sound image of the virtual sound source located at the source point to the listener positioned at the center point.

8. An apparatus for positioning a sound image of a virtual sound source relative to a listener in a virtual sound field, comprising:

a database that provisionally memorizes acoustic transfer characteristics of the virtual sound field in correspondence to sample points distributed radially around a center point of the listener at a fixed radius;

left and right filters that respectively filter audio signals of left and right channels according to the acoustic transfer characteristics loaded from the database;

an input that designates a source point at which the virtual sound source is to be located within the virtual sound field in terms of a geometric distance and a geometric direction relative to the center point;

a processor that computes a leftward acoustic direction from the source point to a left ear of the listener according to said geometric distance, said geometric direction and an offset of the left ear from the center point, and that computes a rightward acoustic direction from the source point to a right ear of the listener according to said geometric distance, said geometric direction and an offset of the right ear from the center point;

a controller that specifies a leftward sample point coincident with the leftward acoustic direction to load an effective acoustic transfer characteristic corresponding to the leftward sample point from the database into the left filter, and that specifies a rightward sample point coincident with the rightward acoustic direction to load another effective acoustic transfer characteristic corresponding to the rightward sample point from the database into the right filter; and a feeder that feeds an audio signal of the left channel to the left filter and feeds another audio signal of the right channel to the right filter to thereby direct the sound image of the virtual sound source located at the source point to the listener positioned at the center point.

9. An apparatus according to claim 8, wherein the controller comprises means for specifying a pair of leftward sample points which lie oppositely relative to the leftward acoustic direction such that said effective acoustic transfer characteristic is determined by interpolating the acoustic transfer characteristics corresponding to the pair of the leftward sample points, and for specifying a pair of rightward sample points which lie oppositely relative to the rightward acoustic direction such that said another effective acoustic transfer characteristic is determined by interpolating the acoustic transfer characteristics corresponding to the pair of the rightward sample points.

10. An apparatus according to claim 8, wherein the processor comprises means for computing an azimuth component of the leftward acoustic direction from the source point to the left ear of the listener in a three-dimensional space of the virtual sound field such that the leftward sample point is selected substantially coincident with the azimuth component of the leftward acoustic direction, and for computing an azimuth component of the rightward acoustic direction from the source point to the right ear of the listener such that the rightward sample point is selected substantially coincident with the azimuth component of the rightward acoustic direction, thereby directing the sound image of the virtual sound source to the listener in an azimuth direction of the three-dimensional space.

11. An apparatus according to claim 10, further comprising means for computing an elevation component of an acoustic direction from the source point to the listener according to said geometric distance and said geometric direction, and means for filtering the audio signal according to the elevation component of the acoustic direction so as to position the sound image of the virtual sound source relative to the listener in an elevation direction of the three-dimensional space.

12. A machine readable medium for use in an apparatus having a CPU and for positioning a sound image of a virtual sound source relative to a listener in a virtual sound field by filtering audio signals of left and right channels through left and right filters which simulate acoustic transfer characteristics of the virtual sound field, said medium containing program instructions executable by the CPU for causing the apparatus to perform the steps of:

provisionally memorizing acoustic transfer characteristics of the virtual sound field allotted to sample points distributed radially around a center point of the listener;

designating a source point at which the virtual sound source is to be located within the virtual sound field in terms of a geometric distance and a geometric direction relative to the center point;

computing a leftward acoustic direction from the source point to a left ear of the listener according to said geometric distance, said geometric direction and an offset of the left ear from the center point;

computing a rightward acoustic direction from the source point to a right ear of the listener according to said geometric distance, said geometric direction and an offset of the right ear from the center point;

selecting a leftward sample point substantially coincident with the leftward acoustic direction to determine an effective acoustic transfer characteristic based on the acoustic transfer characteristics allotted to the leftward sample point so as to enable the left filter to simulate said effective transfer characteristic;

selecting a rightward sample point substantially coincident with the rightward acoustic direction to determine another effective acoustic transfer characteristic based on the acoustic transfer characteristics allotted to the rightward sample point so as to enable the right filter to simulate said another effective transfer characteristic; and filtering an audio signal of the left channel through the left filter and filtering another audio signal of the right channel through the right filter to thereby direct the sound image of the virtual sound source located at the source point to the listener positioned at the center point.

13. A machine readable medium according to claim 12, wherein the step of selecting a leftward sample point comprises selecting a pair of leftward sample points which lie oppositely relative to the leftward acoustic direction so that said effective acoustic transfer characteristic is determined by interpolating the acoustic transfer characteristics allotted to the pair of the leftward sample points, and wherein the step of selecting a rightward sample point comprises selecting a pair of rightward sample points which lie oppositely relative to the rightward acoustic direction so that said another effective acoustic transfer characteristic is determined by interpolating the acoustic transfer characteristics allotted to the pair of the rightward sample points.

14. A machine readable medium according to claim 12, wherein the step of computing a leftward acoustic direction comprises computing an azimuth component of the leftward acoustic direction from the source point to the left ear of the listener in a three-dimensional space of the virtual sound field so that the leftward sample point is selected substantially coincident with the azimuth component, of the leftward acoustic direction, and wherein the step of computing a rightward acoustic direction comprises computing an azimuth component of the rightward acoustic direction from the source point to the right ear of the listener so that the rightward sample point is selected substantially coincident with the azimuth component of the rightward acoustic direction, thereby positioning the sound image of the virtual sound source relative to the listener in an azimuth direction of the three-dimensional space.

15. A machine readable medium according to claim 14, wherein the steps further comprise computing an elevation component of an acoustic direction from the source point to the listener according to said geometric distance and said geometric direction, and filtering the audio signal according to the elevation component of the acoustic direction so as to position the sound image of the virtual sound source relative to the listener in an elevation direction of the three-dimensional space.

16. An apparatus for positioning a sound image of a virtual sound source relative to a listener in a virtual sound field comprising:

a database that provisionally memorizes the acoustic transfer characteristics of the virtual sound field in correspondence to reference source points which are distributed radially around a center point of the listener;

a processor that designates a source point at which the virtual sound source is to be located within the virtual sound field in terms of a geometric distance and a geometric direction relative to the center point;

a processor that computes a leftward acoustic direction from the source point to a left ear of the listener according to the geometric distance, the geometric direction and an offset of the left ear form the center point;

a processor that computes a rightward acoustic direction from the source point to a right ear of the listener according to the geometric distance, the geometric direction and an offset of the right ear from the center point;

a processor that determines an effective acoustic transfer characteristic based on the memorized acoustic transfer characteristics according to the leftward acoustic direction so as to enable the left filter to simulate said effective transfer characteristic;

a processor that determines another effective acoustic transfer characteristic based on the memorized acoustic transfer characteristics according to the rightward acoustic direction so as to enable the right filter to simulate said another effective transfer characteristic; and left and right filters that respectively filter an audio signal of the left channel and another audio signal of the right channel to thereby direct the sound image of the virtual sound source located at the source point to the listener positioned at the center point.

17. An apparatus for positioning a sound image of a virtual sound source relative to a listener in a virtual sound field comprising:

a database that provisionally memorizes acoustic transfer characteristics of the virtual sound field allotted to sample points distributed radially around a center point of the listener;

a processor that designates a source point at which the virtual sound source is to be located within the virtual sound field in terms of a geometric distance and a geometric direction relative to the center point;

a processor that computes a leftward acoustic direction from the source point to a left ear of the listener according to said geometric distance, said geometric direction and an offset of the left ear from the center point;

a processor that computes a rightward acoustic direction from the source point to a right ear of the listener according to said geometric distance, said geometric direction and an offset of the right ear from the center point;

a controller that selects a leftward sample point substantially coincident with the leftward acoustic direction to determine an effective acoustic transfer characteristic based on the acoustic transfer characteristics allotted to the leftward sample point so as to enable the left filter to simulate said effective transfer characteristic;

a controller that selects a rightward sample point substantially coincident with the rightward acoustic direction to determine another effective acoustic transfer characteristic based on the acoustic transfer characteristics allotted to the rightward sample point so as to enable the right filter to simulate said another effective transfer characteristic; and left and right filters that respectively filter an audio signal of the left channel through the left filter and another audio signal of the right channel through the right filter to thereby direct the sound image of the virtual sound source located at the source point to the listener positioned at the center point.

18. The apparatus of claim 17, wherein the controller that selects a leftward sample point selects a pair of leftward sample points which lie oppositely relative to the leftward acoustic direction such that said effective acoustic transfer characteristic is determined by interpolating the acoustic transfer characteristics allotted to the pair of the leftward sample points, and wherein the controller that selects a rightward sample point selects a pair of rightward sample points which lie oppositely relative to the rightward acoustic direction such that said another effective acoustic transfer characteristic is determined by interpolating the acoustic transfer characteristics allotted to the pair of the rightward sample points.

19. The apparatus of claim 17, wherein the processor that computes the leftward acoustic direction computes an azimuth component of the leftward acoustic direction from the source point to the left ear of the listener in a three-dimensional space of the virtual sound field such that the leftward sample point is selected substantially coincident with the azimuth component of the leftward acoustic direction, and wherein the processor that computes the rightward acoustic direction computes an azimuth component of the rightward acoustic direction from the source point to the right ear of the listener such that the rightward sample point is selected substantially coincident with the azimuth component of the rightward acoustic direction, thereby directing the sound image of the virtual sound source to the listener in an azimuth direction of the three-dimensional space.

20. The apparatus of claim 19, further comprising:

a processor that computes an elevation component of an acoustic direction from the source point to the listener according to said geometric distance and said geometric direction; and filtering means for filtering the audio signals according to the elevation component of the acoustic direction so as to direct the sound image of the virtual sound source to the listener in an elevation direction of the three-dimensional space.

* * * * *